(12) United States Patent
Halik et al.

(10) Patent No.: US 7,387,872 B2
(45) Date of Patent: Jun. 17, 2008

(54) SOLUTION AND METHOD FOR THE TREATMENT OF A SUBSTRATE, AND SEMICONDUCTOR COMPONENT

(75) Inventors: Marcus Halik, Erlangen (DE); Guenter Schmid, Hemhofen (DE); Hagen Klauk, Stuttgart (DE); Florian Eder, Erlangen (DE); Ute Zschieschang, Stuttgart (DE)

(73) Assignee: Qimonda AG, Munich (DE)

(*) Notice: Subject to any disclaimer, the term of this patent is extended or adjusted under 35 U.S.C. 154(b) by 98 days.

(21) Appl. No.: 11/318,065

(22) Filed: Dec. 22, 2005

(65) Prior Publication Data

US 2006/0159945 A1    Jul. 20, 2006

Related U.S. Application Data

(63) Continuation of application No. PCT/DE2004/001245, filed on Jun. 14, 2004.

(30) Foreign Application Priority Data

Jun. 23, 2003    (DE)    ................. 103 29 262

(51) Int. Cl.
- *B05D 3/12* (2006.01)
- *B05D 1/02* (2006.01)
- *B05D 1/18* (2006.01)
- *B05D 5/00* (2006.01)

(52) U.S. Cl. .................... 430/538; 430/192; 428/537.5; 427/421.1; 427/240

(58) Field of Classification Search ................. 430/192, 430/538; 428/537.5; 427/421.1, 240
See application file for complete search history.

(56) References Cited

U.S. PATENT DOCUMENTS

| | | | |
|---|---|---|---|
| 4,355,081 | A | 10/1982 | Kinsley, Jr. |
| 5,563,011 | A | 10/1996 | Shipley |
| 5,807,947 | A | 9/1998 | Vicari et al. |
| 5,872,200 | A | 2/1999 | Sharma et al. |
| 5,892,037 | A | 4/1999 | Steinmann |
| 5,959,051 | A | 9/1999 | Kaneko et al. |
| 6,146,497 | A | 11/2000 | Nguyen |
| 6,218,083 | B1 | 4/2001 | McCullough et al. |
| 6,506,534 | B1 | 1/2003 | Nozaki et al. |
| 2003/0015691 | A1 | 1/2003 | Haghighat et al. |
| 2003/0108664 | A1 | 6/2003 | Kodas et al. |
| 2003/0215658 | A1 | 11/2003 | Bermel |

FOREIGN PATENT DOCUMENTS

| | | |
|---|---|---|
| DE | 1 931 295 | 1/1970 |
| EP | 0 094 165 A2 | 11/1983 |
| EP | 0 606 889 A1 | 7/1994 |
| EP | 0 827 025 A1 | 3/1998 |
| EP | 1 073 993 B1 | 11/2002 |

*Primary Examiner*—Thorl Chea
(74) *Attorney, Agent, or Firm*—Slater & Matsil, L.L.P.

(57) ABSTRACT

An embodiment of the invention provides a method for the treatment of a substrate made of paper or a substrate containing paper as support material for a semiconductor component. In an embodiment, the substrate surface is contacted with a solution comprising at least one phenol-containing base polymer and/or copolymer and a crosslinker component. A polymer formulation deposits from the solution onto the surface. The solution may further include an acid catalyst. Embodiments include a semiconductor component formed according to the method of the invention.

23 Claims, 6 Drawing Sheets

Für R₁ gilt: —O—, —S—, —SO₂—, —S_z—, —(CH₂)_x— wobei x = 1 - 10, ausserdem:

Für R₂ gilt: Alkyl mit 1 bis 10 Kohlenstoffatomen oder Aryl

SOLUTION AND METHOD FOR THE TREATMENT OF A SUBSTRATE, AND SEMICONDUCTOR COMPONENT

This application is a continuation of co-pending International Application No. PCT/DE2004/001245, filed Jun. 14, 2004, which designated the United States and was not published in English, and which is based on German Application No. 103 29 262.4, filed Jun. 23, 2003, both of which applications are incorporated herein by reference.

TECHNICAL FIELD

The invention relates generally to semiconductor manufacturing and more particularly to transistors, organic field effect transistors, and substrates for forming transistors thereon.

BACKGROUND

The introduction of RF-ID systems as a potential replacement for the bar code, which is susceptible to faults and may be used only in direct visual contact with the scanner, or as a security feature on packaging and other goods is deemed to be a forward-looking application for extremely inexpensive electronics. On account of the flexibility and the large variation range of packaging materials, circuits on flexible substrates, which can be produced in large numbers in roll-to-roll methods, are particularly of interest. On account of the enormous price pressure of such applications, silicon-based circuits are typically suitable only for performance-driven special applications, but not for the mass market.

Alternative systems with integrated circuits based on organic field effect transistors (OFET) constitute a possible solution for this mass application sector of inexpensive electronics.

Semiconducting polymers or organic semiconductors offer the potential, on the other hand, that inexpensive printing techniques may be used for their patterning and application. The gate potential for controlling the transistors may be chosen to be smaller, and the thinner the gate dielectric may be fabricated.

For direct integration into the production process of a packaging, the substrate compatibility is of particular interest. If the packaging is composed of paper or similar materials containing cellulose fibers, the polymer electronics should be integrable directly onto this support material. However, paper generally has a very rough surface, so that its use as a substrate makes high requirements of the integration process.

Although the use of paper as a substrate for polymer electronics is proposed in EP 1 073 993 B1, a concrete realization method is not specified. It is also known that paper is suitable as a substrate for the production of electrochromic displays or electrochemical transistors, without production details being known.

SUMMARY OF THE INVENTION

The present invention provides a method for arranging semiconductor components on rough surfaces. The invention also provides a semiconductor component on a correspondingly prepared layer.

An embodiment of the invention provides a method for the treatment of a substrate made of paper or for the treatment of a paper-containing substrate as support material for a semiconductor component. In an embodiment, the substrate surface is contacted with a solution comprising at least one phenol-containing base polymer and/or copolymer and a crosslinker component. A polymer formulation deposits from the solution on the surface.

The use of a solution comprising at least one phenol-containing base polymer and/or copolymer enables a surface coating of paper or some other rough surface of a paper-containing substrate which permits e.g. an integration of field effect transistors, in particular organic field effect transistors.

The phenol-containing base polymer is preferably a poly-4-vinylphenol, a poly-4-vinylphenol-co-2-hydroxyethyl methacrylate and/or a poly-4-vinylphenol-co-methyl methacrylate.

The crosslinker component is preferably a di- or tribenzyl alcohol compound, such as 4-hydroxymethylbenzyl alcohol. In other embodiments, the crosslinker component is a formaldehyde generator such as polymelamine-co-formaldehyde methylated, and/or an electrophilic crosslinker system such as 4-hydroxymethylbenzyl alcohol and/or 4-toluenesulfonic acid.

Preferably at least one electrophilic crosslinker component comprises one of the following compounds:

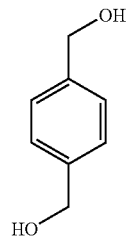

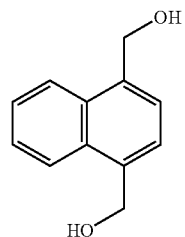

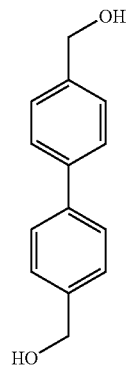

-continued
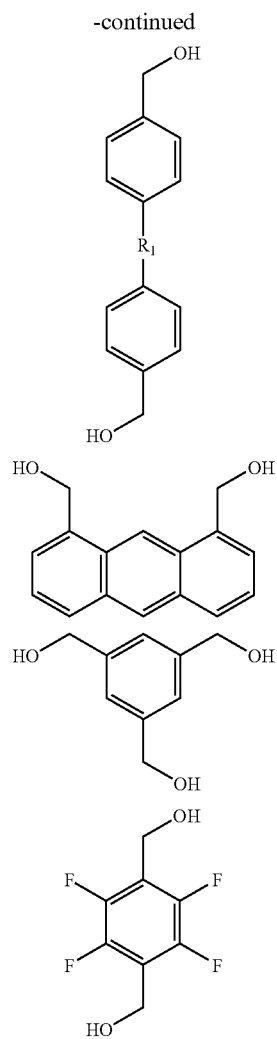
wherein $R_1$ comprises —O—, —S—, —SO$_2$—, —S$_2$—, —(CH$_2$)$_x$— wherein x=1-10, or one or more following structures:
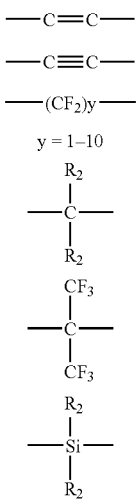
-continued
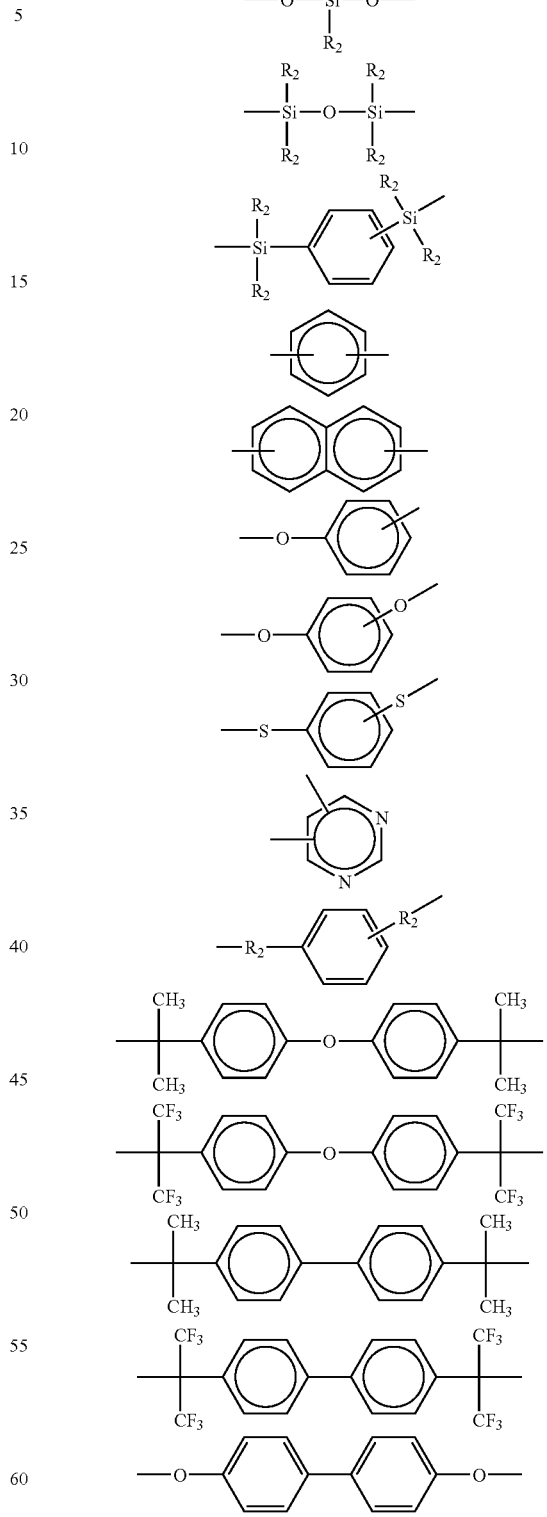
and wherein each occurrence of $R_2$ independently comprises an alkyl having 1 to 10 carbon atoms or an aryl.
In preferred embodiments, the solution contains a thermal acid generator. Preferably, the thermal acid generator can transfer a proton to the hydroxyl group of a benzyl alcohol such as 4-toluenesulfonic acid at temperatures below about 150° C.

Other embodiments may include using a photoacid generator in the solution. In a preferred embodiment, the photoacid generator (PAG), after irradiation with UV light, generates a photoacid which subsequently effects the transfer of a proton to the hydroxyl group of a benzyl alcohol such as a sulfonium and/or iodonium salt.

An alcohol is preferably used as a solvent. Suitable alcohols include n-butanol, and/or dioxan, N-methylpyrrolidone (NMP), γ-butyrolactone, xylene and/or propylene glycol monomethyl ether acetate (PGMEA), for example.

In preferred embodiments, superior film properties are formed when the proportion by mass of the solution lies between about 5% and about 20%.

In an embodiment, the solution comprises about 100 parts of a base polymer, about 10 parts to about 20 parts of an electrophilic crosslinker, and about 1 part to about 10 parts of an acid catalyst.

In another embodiment, the solution comprises about 100 parts of the base polymer, about 10 parts to about 20 parts of the eletrophilic crosslinker, and about 0.2 parts to about 10 parts PAG.

Other embodiments of the invention provide method for the treatment of a substrate. The substrate may comprise paper or a paper-containing substrate, such as paper as support material for a semiconductor component. Preferably, the method includes contacting the surface a solution formed according preferred embodiments of the invention. The contacting causes a polymer formulation to deposit from the solution onto the surface. The deposit smoothes the fibers of the surface with the order of magnitude of the layer thickness of the polymer film (100 to 500 nm).

In preferred embodiments, the polymer formulation deposits areally and/or in patterned fashion on the surface. Preferred methods for applying the solution include spin coating, spray coating, printing and/or dipping processes.

In another embodiment, a thermal crosslinking and/or a photoinduced crosslinking of the polymer formulation on the surface are performed. Preferably, the thermal crosslinking is performed at a temperature of between about 120° C. and about 200° C.

Still another embodiment of the invention provides a semiconductor component, preferably, an organic field effect transistor. The substrate may have a surface that is treated according to embodiments of the invention. Preferably the substrate is a paper, in particular a smooth, hot-pressed, wood-free paper without readily soluble fillers. Particularly cost-effective semiconductor components can thus be produced.

DESCRIPTION OF THE DRAWINGS

The invention is explained in more detail below using a plurality of exemplary embodiments with reference to the figures of the drawings, in which.

Figure 1A:
FIGS. 1A, B show a drawing of scanning electron micrographs of cellulose fibers.

The following list of reference symbols may be used in conjunction with the figures:
20 base substrate for OFET 23b drain layer
21 gate electrode 24 active semiconductor layer
22 gate dielectric layer 25 passivation layer
23a source layer

DETAILED DESCRIPTION OF ILLUSTRATIVE EMBODIMENTS

Before embodiments of the invention are discussed, a description will be given of the basic problem of rough surfaces as a basis for semiconductor components. In this case, this is described with reference to substrates made of paper, although embodiments encompass paper-containing substrates (e.g. composite materials comprising paper and plastic), to be treated with a solution according to the invention and/or the method according to the invention, so that a semiconductor component may be arranged on the substrate.

Figure 1B:
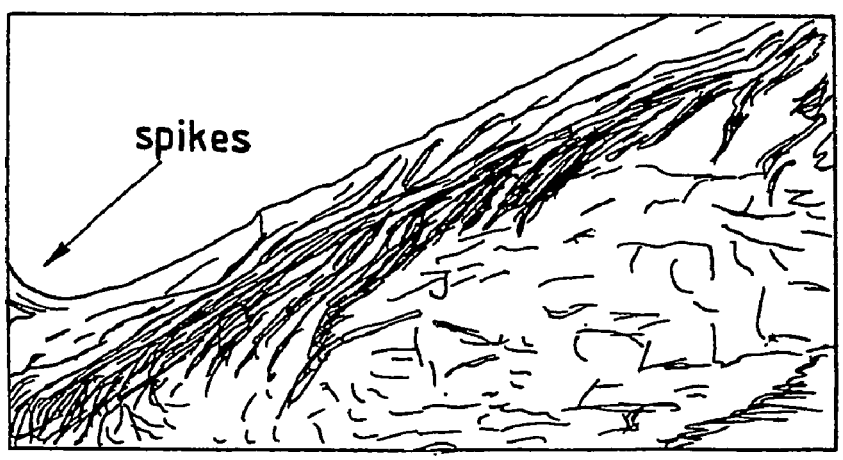

Papers differ in contrast to other flexible substrates (e.g. plastic films) in that they are essentially constructed from cellulose-based fibers that, together with diverse fillers, form a three-dimensional network. In this case, however, in most of the papers fiber structures are present on the surface of the paper, the consequence of which is that the surface of the paper has a roughness corresponding to the order of magnitude of the cellulose fibers used (a number of micrometers) and the fibers themselves exhibit a surface roughness of hundreds of nanometers. This is illustrated in FIGS. 1A and 1B.

Special papers are also known (photoglossy paper, inkjet paper) in which the surface roughness is reduced by a film lamination. However, these film laminations are not resistant to process conditions such as are required e.g. during the fabrication of integrated circuits based on organic field effect transistors (thermal stability up to 200° C., solvent resistance—basic aqueous solvents, organic solvents). Furthermore, these special papers are relatively expensive, which makes them unsuitable for the use of mass-produced articles.

In general, the roughness of the paper, and also the absorption of solvents (water, acetone, alcohols, etc.) and the associated swelling behavior of the paper prove to be problematic for the processing and integration of organic thin film transistors which have an overall thickness (cf. FIG. 3) of between 200 nm and 1 μm and in the case of which feature sizes of less than 5 μm (channel length—distance between source and drain contacts) have to be imaged without any errors.

Embodiments of the invention provide a method for producing a process-compatible surface coating on papers in a cost-effective manner, so that it is subsequently possible to produce organic thin film transistors and ICs based thereon on these papers. Other embodiments encompass unlamented papers, particularly those which have no readily soluble fillers and are wood-free and smooth (e.g. hot-pressed).

Figure 2:
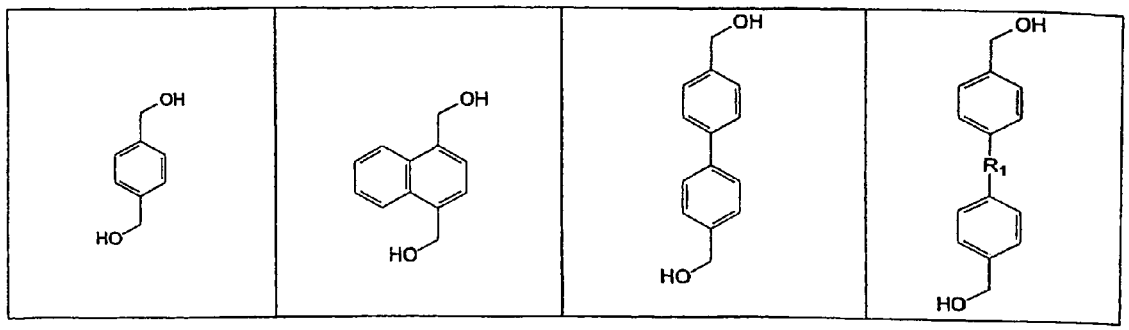
FIG. 2 shows structural formula for electrophilic crosslinkers.
Figure 2:
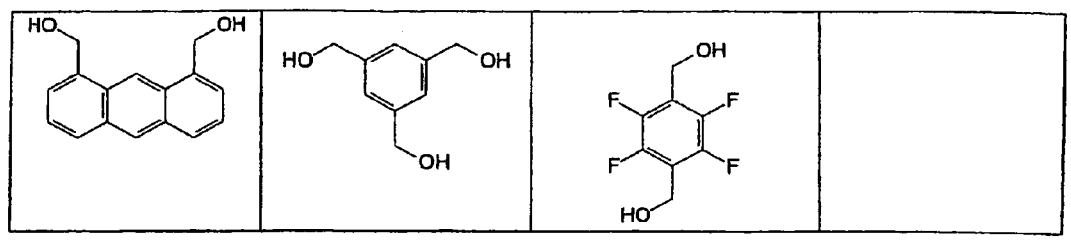
Figure 2:
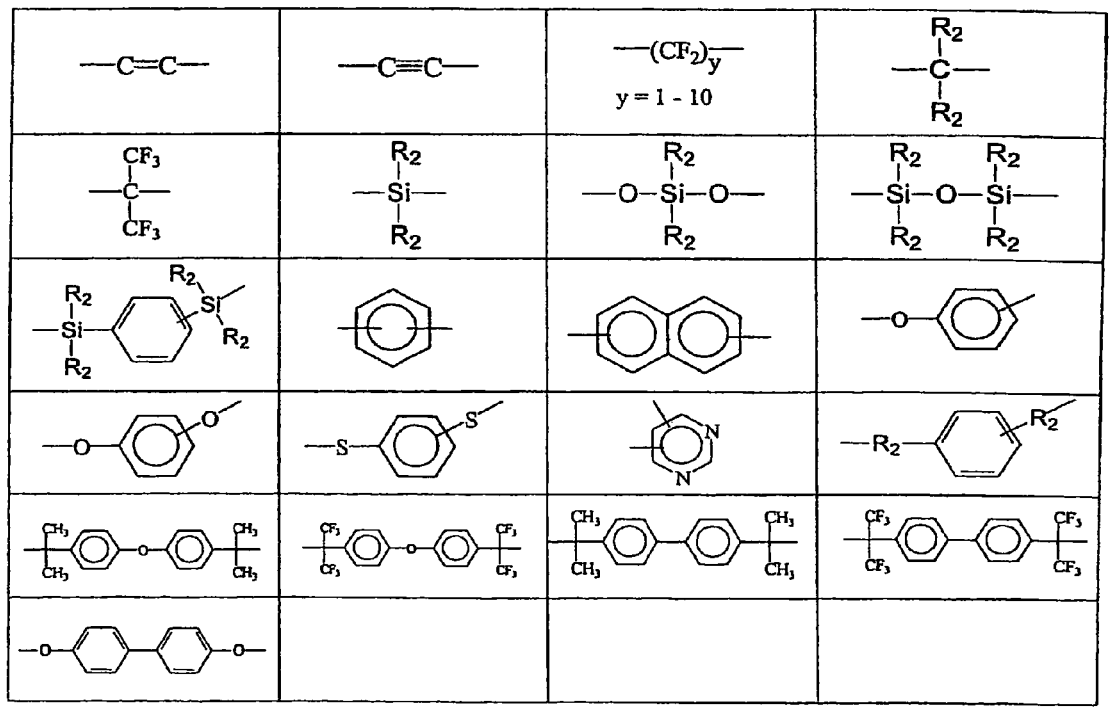

In the exemplary embodiment, a polymer formulation is applied to the paper surface areally or in patterned fashion. A formulation of poly-4-vinylphenol with a crosslinker component in an organic solvent (e.g. alcohols, PGMEA) is preferred. In general, all formaldehyde generators (e.g. poly-melamine-co-formaldehyde methylated) and other electrophilic crosslinker systems (e.g. 4-hydroxymethylbenzyl alcohol/4-toluenesulfonic acid) are suitable as the crosslinker component. FIG. 2 illustrates compounds that may serve as electrophilic crosslinkers.

These polymer layers, applied to the paper surface, may be chemically crosslinked by supplying thermal energy (at about 120° C. to about 200° C.) and thus form a thin polymer film on the surface of the paper which is chemically resistant and smooth and permits the fabrication of organic thin film transistors thereon. This polymer layer also prevents swelling (introduction of solvent into the paper structure) of the paper. In preferred embodiments, the polymer film is very thin (100-500 nm), therefore, it does not influence the macroscopic properties of the paper (e.g. flexibility, color, etc.). Rather than a conventional planarization method in which the paper surface and thus the fibers on the surface are embedded in a thick polymer layer, embodiments provide a surface smoothing of the fibers of the order of magnitude of the layer thickness of the polymer film, about 100 nm to about 500 nm.

Embodiments of the invention may include photo-induced crosslinker systems (PAG+electrophilic crosslinker). These systems advantageously achieve a photopatternability of the polymeric protective layer.

In other embodiments, formulations of other phenol-containing base polymers (e.g. poly-4-vinylphenol-co-2-hydroxyethyl methacrylate or poly-4-vinylphenol-co-methyl methacrylate) are also possible for such applications.

The following embodiments are mentioned by way of example. Suitable base polymers may include all phenol-containing polymers and copolymers thereof, such as poly-4-vinylphenol, poly-4-vinylphenol-co-2-hydroxyethyl methacrylate or poly-4-vinylphenol-co-methyl methacrylate. 4-Hydroxymethylbenzyl alcohol or other di- or tribenzyl alcohol compounds are particularly preferred as the crosslinker component.

Suitable thermal acid catalysts may include all compounds that, below about 150° C., are able to transfer a proton to the hydroxyl group of the benzyl alcohol (e.g. 4-toluenesulfonic acid). Suitable photoacid generators (PAGs) may include all compounds that are able, after irradiation with UV light, to generate a photoacid which subsequently effects the transfer of a proton to the hydroxyl group of the benzyl alcohol (e.g. sulfonium or iodonium salts).

An alcohol, in particular n-butanol, and/or dioxan, N-methylpyrrolidone (NMP), γ-butyrolactone, xylene and/or propylene glycol monomethyl ether acetate (PGMEA) are suitable as solvent.

The following mixtures are quantitatively specified as exemplary embodiments of the invention. In an embodiment, a solution comprises about 100 parts of a base polymer, about 10 to about 20 parts of an electrophilic crosslinker, and about 1 part to about 10 parts of an acid catalyst. In another embodiment, the solution comprises about 100 parts of the base polymer, about 10 to about 20 parts of the electrophilic crosslinker, and about 0.2 parts to about 10 parts of the photo acid generator (PAG).

The proportions by mass preferably lie between about 5% and about 20%.

Two formulations are specified by way of example below:

Formulation 1: 10% strength solution in PGMEA (100:10:2.5)

A mixture of 2 g of PVP (MW approximately 20 000) and 200 mg of 4-hydroxymethylbenzyl alcohol are dissolved in 20.5 g of PGMEA on a shaking apparatus (approximately 3 hours). Afterward, 50 mg of 4-toluenesulfonic acid are added and the solution is shaken for a further hour. Before use, the polymer solution is filtered through a 0.2 µm filter.

Formulation 2: 10% strength solution in PGMEA (100:20:2.5)

A mixture of 2 g of PVP (MW approximately 20 000) and 400 mg of 4-hydroxymethylbenzyl alcohol are dissolved in 20.5 g of PGMEA on a shaking apparatus (approximately 3 hours). Afterward, 50 mg of 4-toluenesulfonic acid are added and the solution is shaken for a further hour. Before use, the polymer solution is filtered through a 0.2 µm filter.

The surface coating is effected with a polymer formulation which is deposited from solution and is applied to the paper surface areally or in patterned fashion. Suitable coating methods include spin coating, spray coating, printing and/or dipping processes.

One exemplary embodiment of the film preparation is as follows:

2 ml of formulation 1 are applied to a paper substrate (Maxigloss 100; UPM Kymmene Group) with a spin coater at 2000 rpm for 22 s. Afterward, this is dried at 100° C. for 2 min on a hotplate. The crosslinking reaction is effected at 200° C. in a furnace under a 400 mbar $N_2$ atmosphere. The film preparation for formulation 2 is effected analogously.

Other embodiments of the invention provide organic transistors and circuits, which may be constructed on the basis of this pretreatment of the paper surface.

Figure 3:
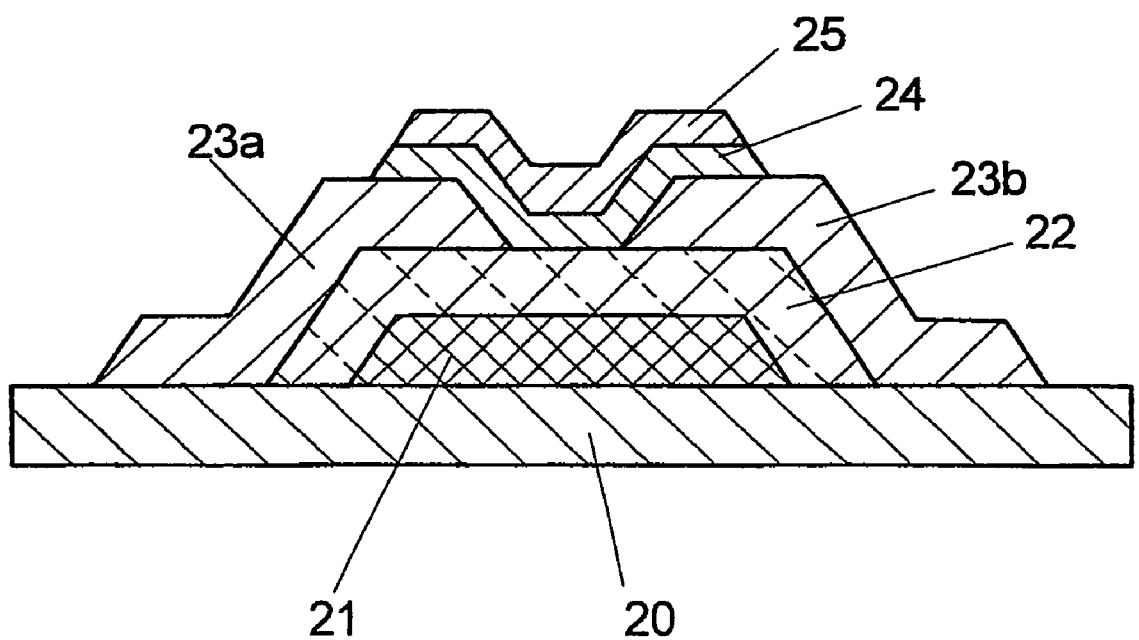
FIG. 3 shows a schematic construction of an organic field effect transistor.

FIG. 3 illustrates the basic construction of an organic field effect transistor (OFET). Organic field effect transistors are electronic components comprising a plurality of layers that are all patterned in order to generate integrated circuits through connections of individual layers. In this case, FIG. 3 shows the fundamental construction of such a transistor in a bottom contact architecture.

A gate electrode 21 is arranged on a base substrate 20, said gate electrode being covered by a gate dielectric layer 22. Such a gate dielectric layer 22 may comprise e.g. a molecular monolayer. Such dielectrics have a layer thickness of less than about 5 nm (bottom up).

A source layer 23a and a drain layer 23b are arranged on the gate dielectric layer 22, and they are both connected to an overlying active semiconducting layer 24. A passivation layer 25 is arranged above the active layer 24.

Figure 4:
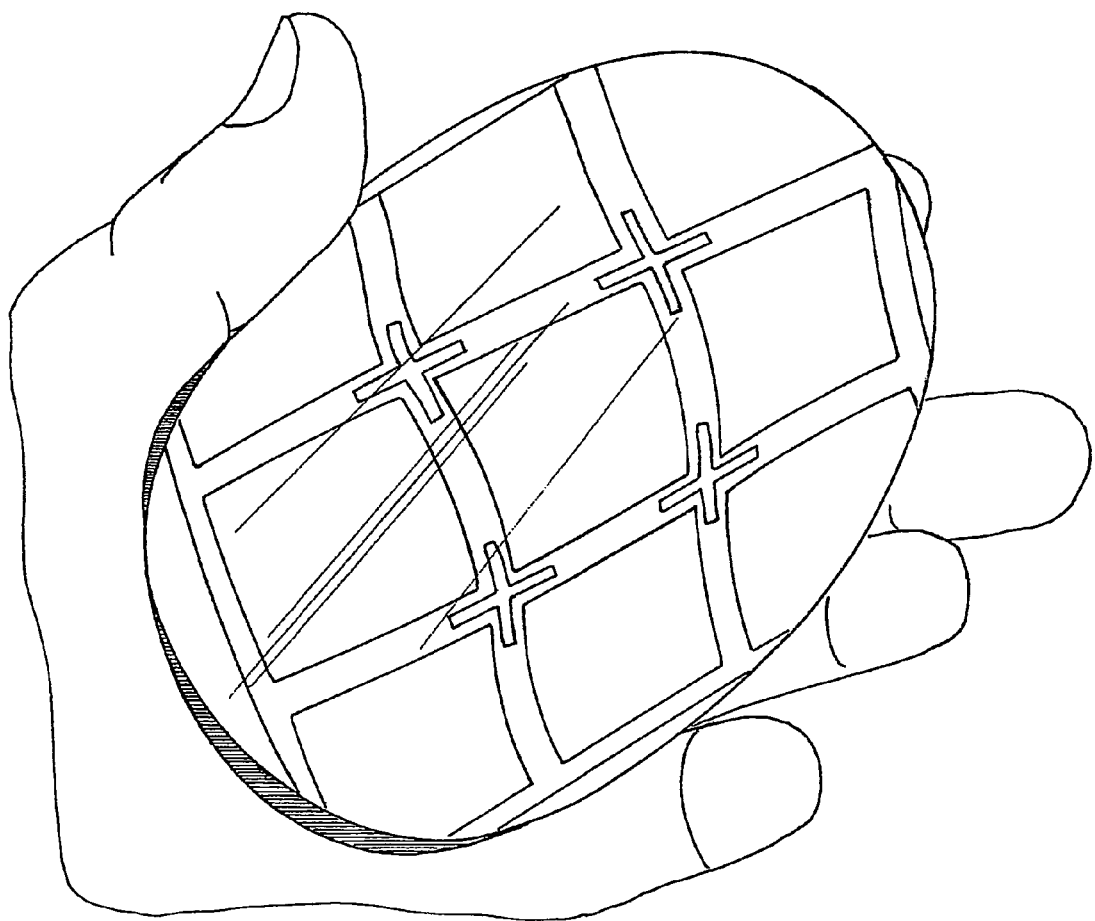
FIG. 4 shows a drawing of a photograph with a paper substrate for an integrated circuit.

FIG. 4 illustrates a tracing of a photograph showing integrated circuits as semiconductor components on a flexible and light paper substrate. This embodiment has a titanium gate layer, a PVP dielectric, a gold source-drain layer and pentacene as organic semiconductor. The circuits are provided on a circular paper substrate, which is significantly bent by the hand illustrated. The right-angled crosses on the substrate therefore appear warped.

Figure 5:
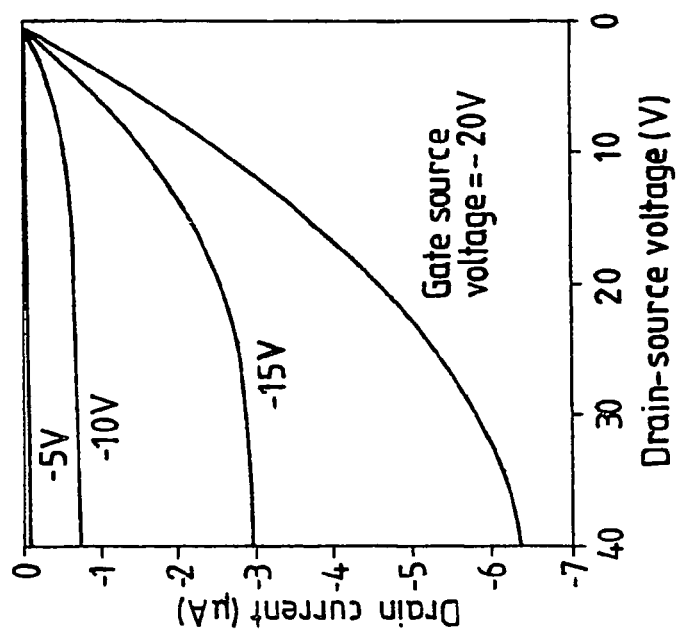
FIG. 5 shows an output characteristic curve of a pentacene OFET on a paper substrate.

FIG. 5 shows the family of output characteristic curves of a pentacene OFET on a paper substrate in accordance with the embodiment illustrated in FIG. 4. The OFET with a PVP gate dielectric has the following data: L=50 µm, W=500 µm, $t_{PVP}$=270 nm, carrier mobility=0.2 $cm^2$/Vs and threshold voltage=−6 V.

Figure 6:
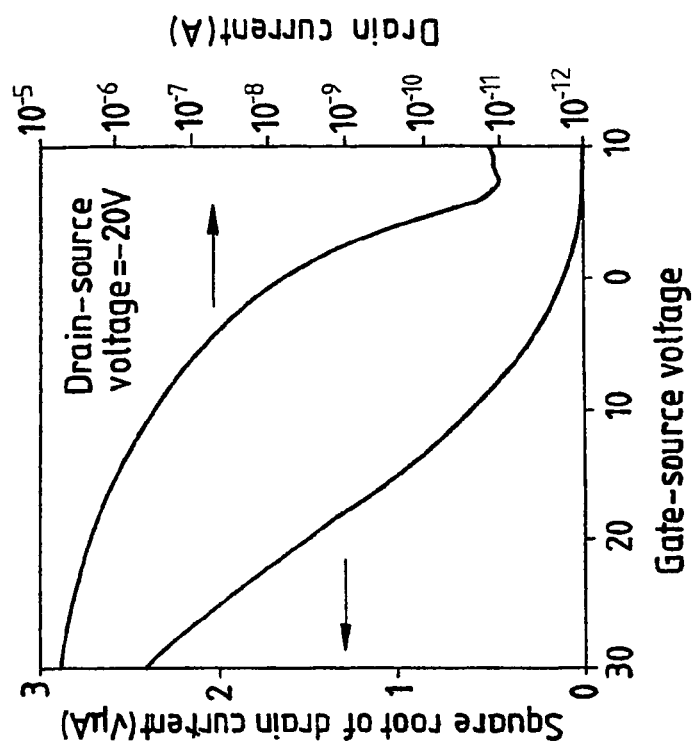
FIG. 6 shows an on-state characteristic curve of a pentacene OFET on a paper substrate.

FIG. 6 illustrates the on-state characteristic curve of the OFET in accordance with FIG. 5 (subthreshold slope=1.8 V/decade), on/off current ratio $10^6$.

Figure 7:
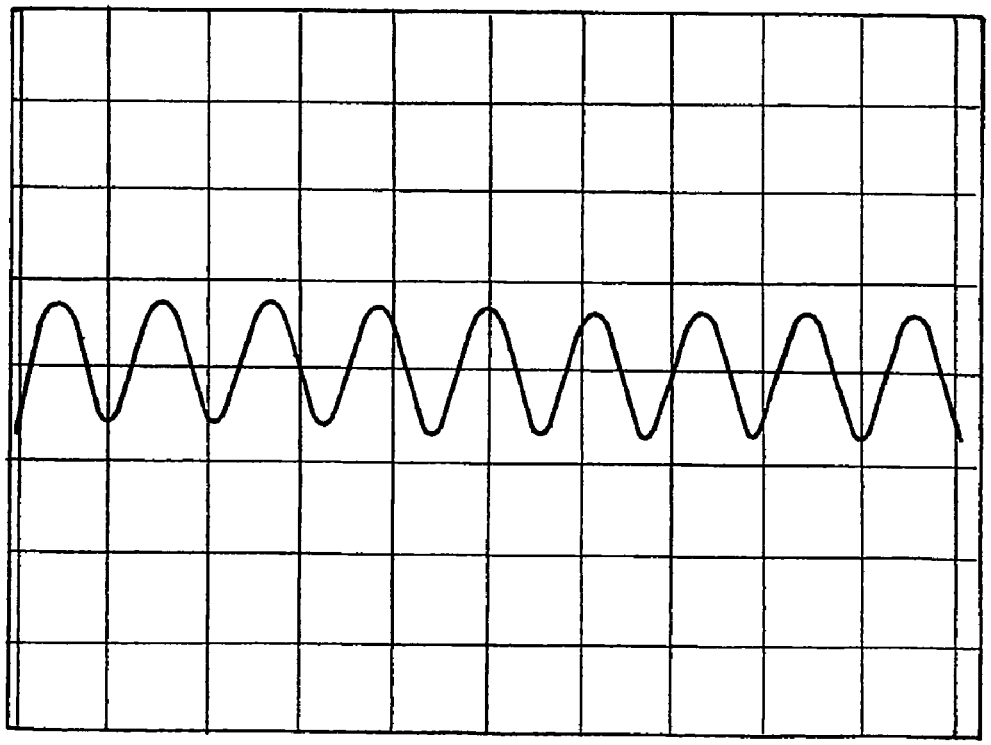
FIG. 7 shows a drawing of a characteristic curve of a 5-stage ring oscillator.

FIG. 7 illustrates a tracing of an oscilloscope image representing the characteristic curve of a 5-stage ring oscillator. The ring oscillator operates with a signal delay of 120 ms per stage.

The embodiment of the invention is not restricted to the preferred exemplary embodiments specified above. Rather, a number of variants are conceivable which make use of the solution according to the invention, the method according to the invention and the semiconductor component according to the invention also in embodiments of fundamentally different configuration.

What is claimed is:

1. A method for treatment of a substrate made of paper or for treatment of a paper-containing substrate as support material for a semiconductor component, the method comprising:
contacting a surface of the substrate with a solution, wherein the solution comprises at least one phenol-containing base polymer and a crosslinker component; and
depositing a polymer layer from the solution on the surface.

2. The method of claim 1, wherein that the phenol-containing base polymer is selected from the group consisting essentially of a poly-4-vinylphenol, a poly-4-vinylphenol-co-2-hydroxyethyl methacrylate, a poly-4-vinylphenol-co-methyl methacrylate, and combinations thereof.

3. The method of claim 2, wherein the crosslinker component is a di- or tribenzyl alcohol compound.

4. The method of claim 2, wherein the crosslinker component comprises at least one of a formaldehyde-releasing component and an electrophilic crosslinker system.

5. The method of claim 2, wherein the crosslinker component comprises methylated polymelamine-co-formaldehyde and 4-hydroxymethylbenzyl alcohol/4-toluenesulfonic acid.

6. The method of claim 2, wherein the crosslinker component comprises one of the following compounds:

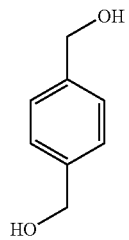

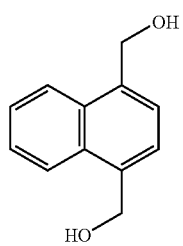

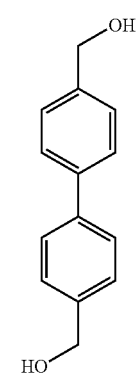

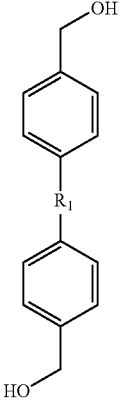

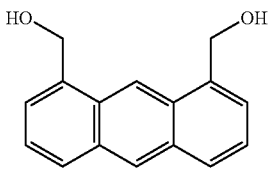

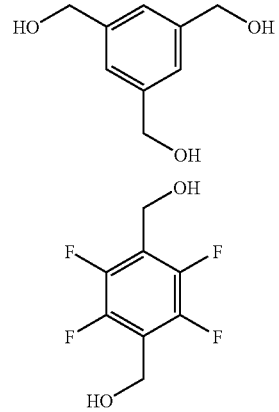

wherein $R_1$ comprises —O—, —S—, —SO$_2$—, —S$_2$—, —(CH$_2$)$_x$— with x=1-10, or one or more of the following structures

—C=C—

—C≡C—

—(CF$_2$)y— y = 1–10

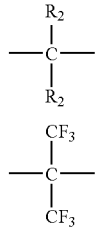

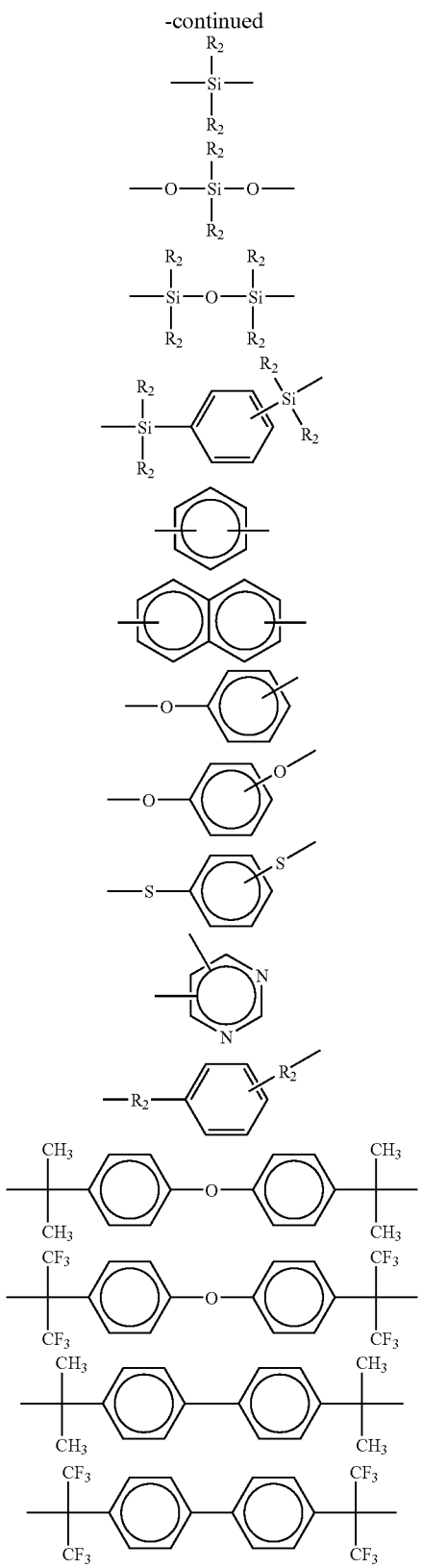

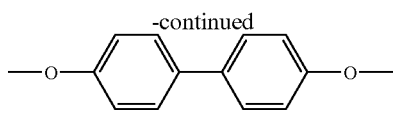

and wherein each occurrence of $R_2$ independently comprises an alkyl having 1 to 10 carbon atoms or an aryl.

7. The method of claim 1, wherein the solution further comprises a thermal acid generator.

8. The method of claim 7, wherein the thermal acid generator transfers a proton to a hydroxyl group of a benzyl alcohol at a temperature less than about 150° C.

9. The method of claim 7, wherein the thermal acid generator is 4-toluenesulfonic acid.

10. The method of claim 1, wherein the solution further comprises a photoacid generator.

11. The method of claim 10, further comprising irradiating the solution with UV light thereby generating a photoacid to effect the transfer of a proton to the hydroxyl group of a benzyl alcohol.

12. The method of claim 10, wherein the photoacid generator is a sulfonium or an iodonium salt.

13. The method of claim 1, wherein the solution further comprises a solvent.

14. The method of claim 13, wherein the solvent consists essentially of an alcohol, dioxan, N-methylpyrrolidone (NMP), γ-butyrolactone, xylene, propylene glycol monomethyl ether acetate (PGMEA), and combinations thereof.

15. The method of claim 13, wherein the solvent is n-butanol.

16. The method claim 1, wherein the solution further comprises an acid catalyst, and wherein a proportion by mass of the base polymer, the crosslinker component and the acid catalyst in the solution is between about 5% and about 20%.

17. The method of claim 16, wherein the solution comprises about 100 parts of the base polymer, between about 10 parts and about 20 parts of the crosslinker component, and between about 1 part and about 10 parts of the acid catalyst.

18. The method of claim 16, wherein the solution comprises about 100 parts of the base polymer, between about 10 parts and about 20 parts of the crosslinker component, and between about 0.2 parts and about 10 parts of the acid catalyst, the acid catalyst comprising a photoacid generator.

19. The method of claim 1, wherein the polymer layer deposits areally on the surface of the substrate.

20. The method of claim 1, wherein contacting the surface of the substrate with the solution and wherein depositing the polymer layer comprises using a process selected from a group consisting of spin coating, spray coating, printing, dipping, and combinations thereof.

21. The method of claim 1, further comprising crosslinking the solution comprising the at least one phenol-containing base polymer on the substrate.

22. The method of claim 21, wherein crosslinking the solution comprises thermally crosslinking the at least one phenol-containing base polymer at a temperature of between about 120° C. and about 200° C.

23. The method of claim 1, wherein the at least one phenol-containing base polymer comprises a copolymer.

* * * * *

UNITED STATES PATENT AND TRADEMARK OFFICE
CERTIFICATE OF CORRECTION

| | |
|---|---|
| PATENT NO. | : 7,387,872 B2 |
| APPLICATION NO. | : 11/318065 |
| DATED | : June 17, 2008 |
| INVENTOR(S) | : Halik et al. |

It is certified that error appears in the above-identified patent and that said Letters Patent is hereby corrected as shown below:

On the Title Page, Item (75) Inventors:, 4th entry, delete "Eder" and insert --Elder--.

Signed and Sealed this

Nineteenth Day of August, 2008

JON W. DUDAS
*Director of the United States Patent and Trademark Office*